United States Patent

Furuta et al.

(10) Patent No.: US 9,866,232 B2
(45) Date of Patent: Jan. 9, 2018

(54) ANALOG-TO-DIGITAL CONVERTER, RADIATION DETECTOR AND WIRELESS RECEIVER

(71) Applicant: KABUSHIKI KAISHA TOSHIBA, Minato-ku, Tokyo (JP)

(72) Inventors: Masanori Furuta, Odawara Kanagawa (JP); Tetsuro Itakura, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/202,138

(22) Filed: Jul. 5, 2016

(65) Prior Publication Data

US 2017/0012638 A1  Jan. 12, 2017

(30) Foreign Application Priority Data

Jul. 7, 2015 (JP) ................. 2015-136215

(51) Int. Cl.
*H03K 9/00* (2006.01)
*H03M 1/46* (2006.01)
*H04B 1/16* (2006.01)

(52) U.S. Cl.
CPC ............. *H03M 1/46* (2013.01); *H04B 1/16* (2013.01)

(58) Field of Classification Search
CPC ............ H03M 1/46; H03M 1/44; H03M 1/12; H03M 1/00; H03M 1/1047; H03M 1/165; H03M 1/20
USPC ............ 341/156, 120, 110, 165, 158, 131; 327/590, 80; 375/355, 356
See application file for complete search history.

(56) References Cited

U.S. PATENT DOCUMENTS

| 4,918,449 A * | 4/1990 | Chin ..................... H03M 1/208 341/156 |
| 8,786,483 B1 | 7/2014 | Thompson et al. |
| 2007/0109161 A1* | 5/2007 | Shimizu .................. H04B 1/30 341/120 |
| 2015/0085985 A1* | 3/2015 | Funaki .................. H03M 1/145 378/98 |

OTHER PUBLICATIONS

Manickam, et al., "A CMOS Electrochemical Impedance Spectroscopy (EIS) Biosensor Array", IEEE Transactions on Biomedical Circuits and Systems, vol. 4, No. 6, Dec. 2010: pp. 379-390.
Manickam, et al., "A CMOS Electrochemical Impedance Spectroscopy (EIS) Biosensor Array", IEEE Transactions on Biomedical Circuits and Systems, vol. 4, No. 6, Dec. 2010: pp. 379-690.

* cited by examiner

*Primary Examiner* — Rahel Guarino
(74) *Attorney, Agent, or Firm* — Holtz, Holtz & Volek PC (57) ABSTRACT

According to an embodiment, an analog-to-digital converter includes a detection circuit, a first conversion circuit, a second comparator, a delay control circuit, a control circuit. A detection circuit detects a differential time signal corresponding to a delay time by using a comparison signal and a delay comparison signal. A first conversion circuit generates a differential voltage by performing time-to-voltage conversion on the differential time signal. A second comparator generates a digital delay determination signal by comparing the differential voltage and an adjustment target voltage. A delay control circuit generates a delay control signal controlling the delay time in accordance with a delay determination signal. A control circuit generates a control signal by using the delay comparison signal in an analog-to-digital conversion period.

12 Claims, 8 Drawing Sheets

ANALOG-TO-DIGITAL CONVERTER, RADIATION DETECTOR AND WIRELESS RECEIVER

CROSS-REFERENCE TO RELATED APPLICATION

This application is based upon and claims the benefit of priority from Japanese Patent Application No. 2015-136215, filed Jul. 7, 2015, the entire contents of which are incorporated herein by reference.

FIELD

Embodiments relate to an analog-to-digital converter.

BACKGROUND

Conventionally, in an asynchronous successive approximation register (SAR) analog-to-digital converter (ADC), an analog-to-digital (AD) conversion time per cycle is determined by applying a predetermined delay time to an output signal of a comparator. Such delay time is determined in advance by, for example, a fixed delay circuit. In the case where the AD conversion time necessary per cycle becomes long, the SARADC using the fixed delay circuit may fall below a predetermined number of cycles with respect to the overall AD conversion time (i.e., resolution is degraded).

In contrast, a SARADC capable of appropriately adjusting a delay time is known. Such SARADC uses a delay circuit which is capable of adjusting the delay time appropriately, and adjusts the delay time by a ring oscillator and a counter. The time delay is adjusted by adjusting an oscillating frequency of the ring oscillator. The oscillating frequency of the ring oscillator is adjusted by a feedback loop so that the value of a counter becomes a predetermined value. According to this SARADC, it is possible to adjust the delay time while AD conversion is in operation (i.e., background adjustment). However, since high-speed operation would be required for the ring oscillator and the counter, there is a problem that large power consumption is required.

As another SARADC, a configuration which adjusts a delay time by counting an AD conversion cycle of a predetermined time is known. Such SARADC detects an output edge of a comparator and increases the value of a counter for the number of detected edges. The value of the counter corresponds to the number of cycles of an AD conversion that occurred during the overall AD conversion time. In other words, this SARADC determines the delay time as being short if the value of the counter is larger than a predetermined value, and as being long if the value of the counter is smaller than the predetermined value. However, since this SARADC performs control by an accumulated value of the value of the counter, there is a problem that a time for adjustment would be required separately (i.e., background adjustment cannot be performed).

DETAILED DESCRIPTION

Hereinafter, embodiments will be described with reference to the drawings.

According to an embodiment, an analog-to-digital converter includes a digital-to-analog converter, a first comparator, a delay circuit, a detection circuit, a first conversion circuit, a second comparator, a delay control circuit, a control circuit. The digital-to-analog converter controls a reference voltage to a predetermined value based on a control signal, and generates a residual voltage using an analog signal and the controlled reference voltage. The first comparator generates a digital comparison signal by comparing the residual voltage and a threshold voltage. The delay circuit controls a delay time based on a delay control signal, and generates a delay comparison signal obtained by delaying the comparison signal by the delay time. The detection circuit detects a differential time signal corresponding the delay time by using the comparison signal and the delay comparison signal. The first conversion circuit generates a differential voltage by performing time-to-voltage conversion on the differential time signal. The second comparator generates a digital delay determination signal by comparing the differential voltage and an adjustment target voltage. The delay control circuit generates the delay control signal controlling the delay time in accordance with the delay determination signal. The control circuit receives a sample clock including a first state corresponding to an analog-to-digital conversion period of the analog signal, and generates the control signal by using the delay comparison signal in the first state.

In the following descriptions, the constituent elements that are the same as or similar to the ones already explained will be given the same or similar reference numbers, and redundant explanations will basically be avoided.

In the following explanations, a cycle of an AD conversion is assumed as performing processing of one bit; however, the processing may also be of two or more bits.

First Embodiment

Figure 1:
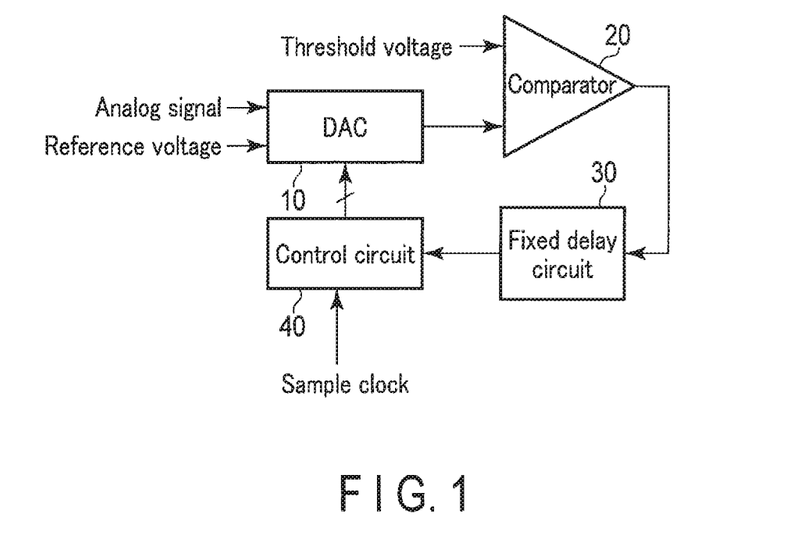
FIG. 1 is a block diagram exemplifying an ADC that corresponds to a comparative example of an ADC according to a first embodiment.

FIG. 1 exemplifies an ADC corresponding to a comparative example of an ADC according to the first embodiment. The ADC depicted in FIG. 1 includes a digital-to-analog converter (DAC) 10, a comparator 20, a fixed delay circuit 30, and a control circuit 40.

The DAC 10 generates a residual voltage using an analog signal and a reference voltage controlled by a control signal.

The comparator 20 generates a comparison signal corresponding to a digital value by comparing the residual voltage and a threshold voltage. The fixed delay circuit 30 generates a fixed delay comparison signal which is obtained by delaying the comparison signal by a predetermined delay time. The control circuit 40 generates the control signal by using the fixed delay comparison signal in an AD conversion period of a sample clock (explained later on).

Figure 2:
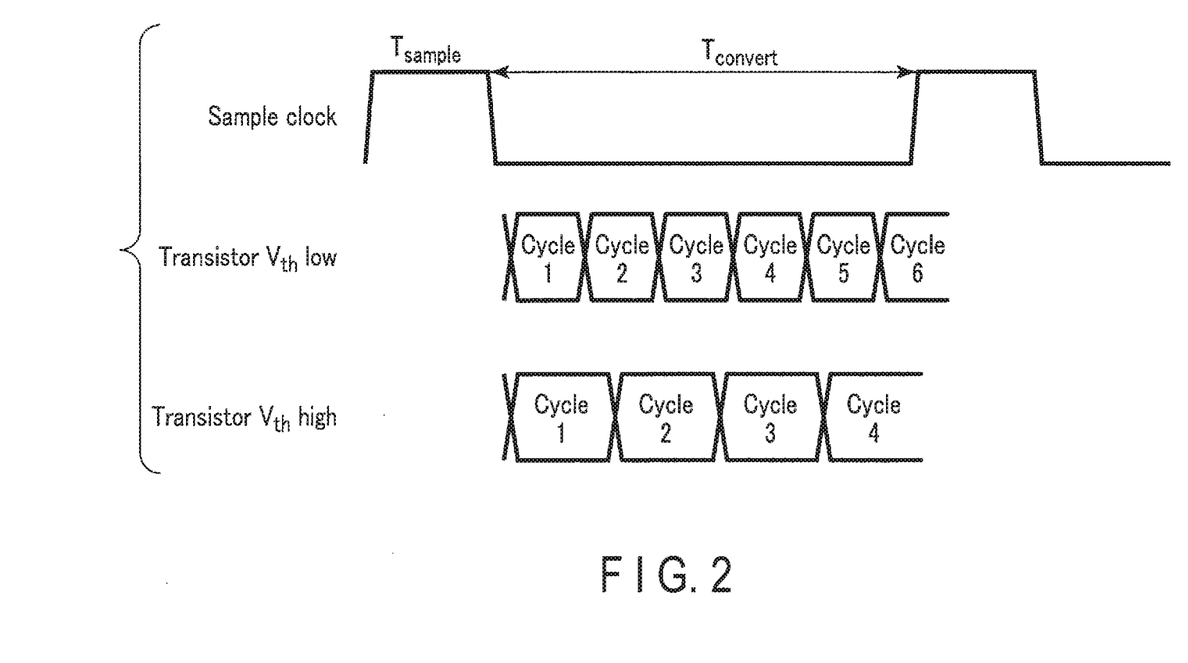
FIG. 2 is a timing chart exemplifying an operation of the ADC depicted in FIG. 1.

The ADC depicted in FIG. 1 operates in the manner exemplified in FIG. 2. The sample clock includes a $T_{convert}$ (also referred to as a first state) corresponding to the AD conversion period of the analog signal and a $T_{sample}$ (also referred to as a second state) corresponding to a sampling period of the analog signal. The $T_{convert}$ corresponds to "0" of the sample clock, and the $T_{sample}$ corresponds to "1" of the sample clock. For example, the ADC depicted in FIG. 1 is determined the AD conversion time of one cycle depending on a threshold voltage ($V_{th}$) of a transistor. Specifically, in the case where the $V_{th}$ of the transistor is low, the AD conversion time of one cycle is short (i.e., the number of AD conversion cycles in the $T_{convert}$ increases), and in the case where the $V_{th}$ of the transistor is high, the AD conversion time of one cycle is long (i.e., the number of AD conversion cycles in the $T_{convert}$ decreases). Here, the AD conversion time of one cycle is determined by the delay time. Accordingly, in the fixed delay circuit 30, a delay time in accordance with the $V_{th}$ of the transistor is set in advance.

However, the AD conversion time of one cycle may change not only by a process condition (for example, the $V_{th}$ of the transistor), but also by an external environment (for example, a power voltage and operation temperature). Therefore, in the ADC of FIG. 1, in some cases, the number of AD conversion cycles in the $T_{convert}$ may fail short of the predetermined number of times, causing degradation in the resolution of the AD conversion.

The ADC according to the first embodiment is capable of controlling the delay time by utilizing a means substituting the function of the fixed delay circuit 30 of FIG. 1.

Figure 3:
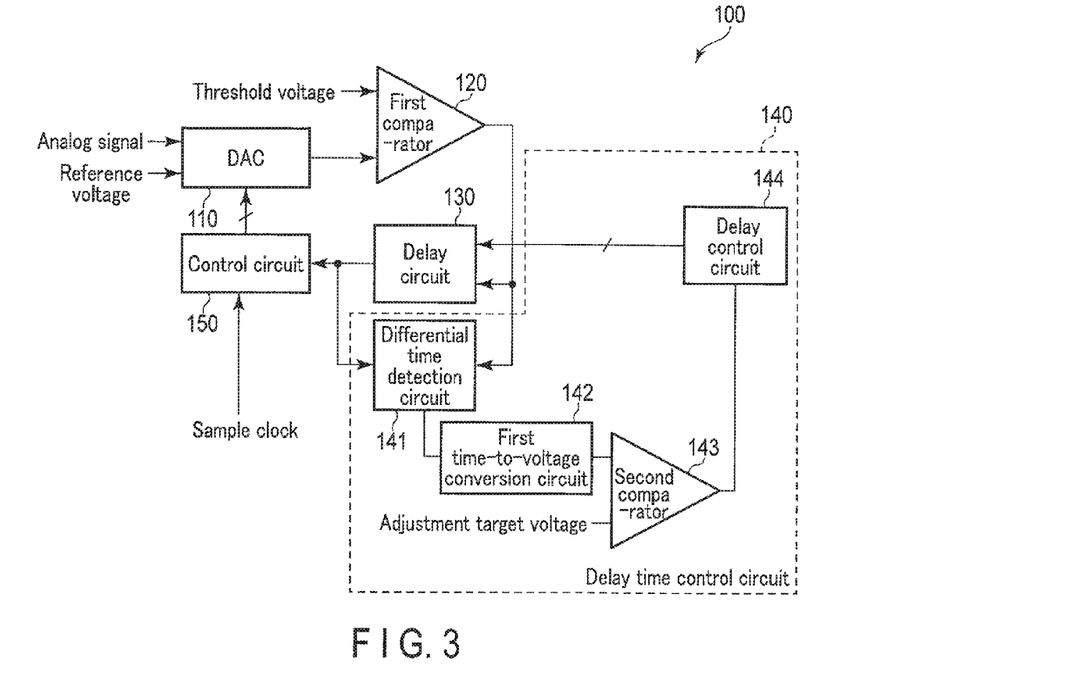
FIG. 3 is a block diagram exemplifying the ADC according to the first embodiment.

As exemplified in FIG. 3, an ADC 100 according to the first embodiment includes a DAC 110, a first comparator 120, a delay circuit 130, a delay time control circuit 140, and a control circuit 150. For example, the ADC 100 uses the sample clock shown in FIG. 2 to perform sampling and AD conversion on an analog signal. In the following, the operation in the AD conversion period (the $T_{convert}$ of the sample clock) will be explained for each unit.

The DAC 110 corresponds to, for example, a capacitive DAC. The DAC 110 receives an analog signal from an unillustrated input unit, and receives a reference voltage from an unillustrated circuit. Furthermore, the DAC 110 receives a control signal $t_{DAC}$ from the control circuit 150. The DAC 110 controls the reference voltage to a predetermined value based on the control signal $t_{DAC}$. The DAC 110 generates a residual voltage by using the analog signal and the controlled reference voltage. The DAC 110 outputs the residual voltage to the first comparator 120. For the DAC 110, an optional DAC such as a resistance DAC may be used.

The first comparator 120 receives the residual voltage from the DAC 110, and receives a threshold voltage from the unillustrated circuit. The first comparator 120 compares the residual voltage and the threshold voltage, and generates a digital comparison signal $t_1$. For example, the first comparator 120 generates a signal corresponding to a digital "1" in the case where the residual voltage is equal to or greater than the threshold voltage, and generates a signal corresponding to a digital "0" in the case where the residual voltage is smaller than the threshold voltage. The first comparator 120 outputs the comparison signal $t_1$ to the delay circuit 130 and a differential time detection circuit 141 (explained later on).

The delay circuit 130 receives the comparison signal $t_1$ from the first comparator 120. Furthermore, in the delay circuit 130 receives a delay control signal which controls a delay time from a delay control circuit 144 (explained later on). In the delay circuit 130, a delay time is set in advance in accordance with a process condition of the ADC 100 (for example, the $V_{th}$ of the transistor). The delay circuit 130 controls the delay time based on the delay control signal, and generates a delay comparison signal $t_2$ by delaying the comparison signal $t_1$ by the delay time. The delay circuit 130 outputs the delay comparison signal $t_2$ to each of the control circuit 150 and the differential time detection circuit 141 (explained later on).

The control circuit 150 receives the delay comparison signal $t_2$ from the delay circuit 130, and receives a sample clock from an unillustrated circuit. The control circuit 150 generates the control signal $t_{DAC}$ by using the delay comparison signal $t_2$ in the $T_{convert}$ corresponding to the AD conversion period of the analog signal. The control circuit 150 outputs the control signal $t_{DAC}$ to the DAC 110. The control circuit 150 holds conversion cycle information which indicates switching of each of the conversion cycles of the AD conversion. The conversion cycle information should indicate, for example, at least one of a starting point and an ending point of each conversion cycle of the AD conversion. The control circuit 150 also outputs a control signal corresponding to a sampling operation of the analog signal to the DAC 110 in the $T_{sample}$ corresponding to the sampling period of the analog signal.

The delay time control circuit 140 includes the differential time detection circuit 141, a first time-to-voltage conversion circuit 142, a second comparator 143, and the delay control circuit 144. The delay time control circuit 140 measures the delay time of the delay circuit 130, and controls the delay circuit 130 in line with a predetermined delay time.

The differential time detection circuit 141 receives the comparison signal $t_1$ from the first comparator 120, and receives the delay comparison signal $t_2$ from the delay circuit 130. The differential time detection circuit 141 uses the comparison signal $t_1$ and the delay comparison signal $t_2$ to detect a differential time signal corresponding to the delay time of the delay circuit 130. The differential time detection circuit 141 outputs the differential time signal to the first time-to-voltage conversion circuit 142.

Specifically, the differential time detection circuit 141 generates the differential time signal by using the difference in the fall time between the comparison signal $t_1$ and the delay comparison signal $t_2$. Alternatively, the differential time detection circuit 141 may generate the differential time signal by using the difference in the rise time between the comparison signal $t_1$ and the delay comparison signal $t_2$, or by using both the difference in the rise time and the difference in the fall time. The differential time detection circuit 141 should be a circuit capable of detecting the differential time between two signals.

The first time-to-voltage conversion circuit 142 corresponds to, for example, a charge pump circuit. The first time-to-voltage conversion circuit 142 receives the differential time signal from the differential time detection circuit 141. The first time-to-voltage conversion circuit 142 generates a differential voltage by time-to-voltage converting the differential time signal. The operation of the first time-to-voltage conversion circuit 142 will be explained in detail later on. The first time-to-voltage conversion circuit 142 outputs the differential voltage to the second comparator 143. As the first time-to-voltage conversion circuit 142, other circuits capable of converting a time signal into a voltage may also be used.

The second comparator 143 receives the differential voltage from the first time-to-voltage conversion circuit 142, and receives an adjustment target voltage from an unillustrated circuit. The second comparator 143 compares the differential voltage and the adjustment target voltage, and generates a digital delay determination signal. For example, the second comparator 143 generates a signal corresponding to a digital "1" in the case where the differential voltage is equal to or greater than the adjustment target voltage, and generates a signal corresponding to a digital "0" in the case where the differential voltage is smaller than the adjustment target voltage. The second comparator 143 outputs the delay determination signal to the delay control circuit 144.

The delay control circuit 144 corresponds to, for example, an up-down counter. The delay control circuit 144 receives the delay determination signal from the second comparator 143. The delay control circuit 144 generates the delay control signal for controlling the delay time, in accordance with the delay determination signal. For example, the delay control circuit. 144 generates a delay control signal for shortening the delay time in the case where the delay determination signal is "1," and generates a delay control signal for lengthening the delay time in the case where the delay determination signal is "0." The delay control circuit 144 outputs the delay control signal to the delay circuit 130. For the delay control circuit 144, other optional counters may also be used.

Figure 4:
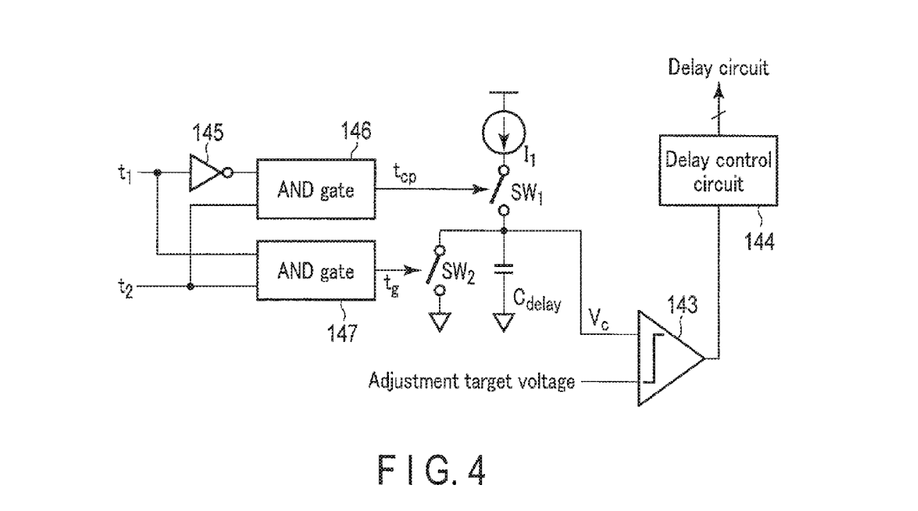
FIG. 4 is a diagram exemplifying a delay time control circuit depicted in FIG. 3.

FIG. 4 shows a specific example of the delay time control circuit 140. The differential time detection circuit 141 includes an INV gate 145, an AND gate 146, and an AND gate 147. The first time-to-voltage conversion circuit 142 includes a constant current source $I_1$, a switch $SW_1$, a switch $SW_2$, and a capacitor $C_{delay}$.

The INV gate 145 receives the comparison signal $t_1$ from the first comparator 120. The INV gate 145 inverts the comparison signal $t_1$. The INV gate 145 outputs the inverted comparison signal $t_1$ to the AND gate 146.

The AND gate 146 receives the inverted comparison signal $t_1$ from the INV gate 145, and receives the delay comparison signal $t_2$ from the delay circuit 130. The AND gate 146 generates a control signal $t_{cp}$ (also referred to as a differential time signal) by obtaining a logical product of the inverted comparison signal $t_1$ and the delay comparison signal $t_2$. The AND gate 146 outputs the control signal $t_{cp}$ to the switch $SW_1$.

The AND gate 147 receives the comparison signal $t_1$ from the first comparator 120, and receives the delay comparison signal $t_2$ from the delay circuit 130. The AND gate 147 generates a control signal $t_g$ by obtaining a logical product of the comparison signal $t_1$ and the delay comparison signal $t_2$. The AND gate 147 outputs the control signal $t_g$ to the switch $SW_2$.

The constant current source $I_1$ generates a constant current signal. The constant current source $I_1$ outputs the constant current signal to the switch $SW_1$.

The switch $SW_1$ receives the control signal $t_{cp}$ from the AND gate 146, and receives the constant current signal from the constant current source $I_1$. If the control signal $t_{cp}$ is High level, the switch $SW_1$ is turned ON to supply the constant current signal to the capacitor $C_{delay}$. On the other hand, if the control signal $t_{cp}$ is at a Low level, the switch $SW_1$ is turned OFF, and the circuit is released.

The capacitor $C_{delay}$ receives the constant current signal during the period in which the switch $SW_1$ is turned ON. The capacitor $C_{delay}$ generates a voltage $V_c$ $(=(I_1 \times T_{delay})/C_{delay})$ on both ends of an electrode during the time the constant current signal is being input. Here, $T_{delay}$ indicates a period in which $t_{cp}$ is at the High level. The voltage $V_c$ corresponds to the aforementioned differential voltage. As for the capacitor $C_{delay}$, since a capacitance corresponding to the constant current signal should be used, if the constant current signal is small, a minute capacitance may be used.

The switch $SW_2$ receives the control signal $t_g$ from the AND gate 147. If the control signal $t_g$ is at the High level, the switch $SW_2$ is turned ON to reset the voltage $V_c$ applied on both ends of the electrode of the capacitor $C_{delay}$. On the other hand, if the control signal $t_g$ is at the Low level, the switch $SW_2$ is turned OFF, and the circuit is released.

Figure 5:
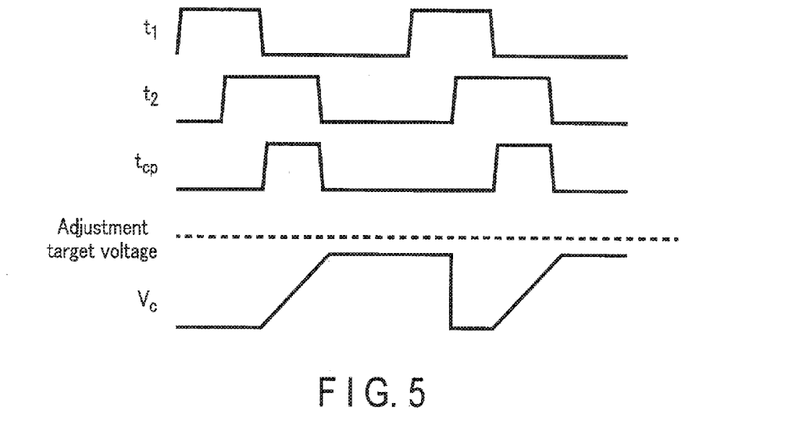
FIG. 5 is a timing chart exemplifying an operation of the delay time control circuit depicted in FIG. 4.

A timing chart exemplifying the operation of the delay time control circuit 140 is shown in FIG. 5. By the delay time being applied, the High level of the comparison signal $t_1$ moves to the position of the High level of the delay comparison signal $t_2$. The High level of the control signal $t_{cp}$ corresponds to the delay time, which is the difference of the fall time between the comparison signal $t_1$ and the delay comparison signal $t_2$. The first time-to-voltage conversion circuit 142 stores charges in the capacitor $C_{delay}$ in a period where the control signal $t_{cp}$ becomes the High level (i.e., the voltage $V_c$ becomes high). The first time-to-voltage conversion circuit 142 resets the charges in the capacitor $C_{delay}$ in a period where the comparison signal $t_1$ and the delay comparison signal $t_2$ become the High level (i.e., the voltage $V_c$ becomes 0).

As explained above, in the analog-to-digital converter according to the first embodiment, the delay time control circuit detects the delay time by using the difference between the input signal and the output signal of the delay circuit, generates the determination signal by comparing the voltage value corresponding to the delay time and a target voltage, and controls the delay time of the delay circuit by the control signal that is generated based on the determination signal. Furthermore, this analog-to-digital converter is capable of controlling the delay time in the background during the analog-to-digital conversion operation of the analog signal. Therefore, according to this analog-to-digital converter, without requiring a high-speed clock, power consumption may be reduced for the delay time control circuit, and the delay time can be adjusted in the background.

Second Embodiment

In the ADC 100 mentioned above, an adjustment target voltage is input from an unillustrated circuit. On the other hand, the ADC according to the second embodiment is capable of generating the adjustment target voltage in an internal circuit of the ADC.

Figure 6:
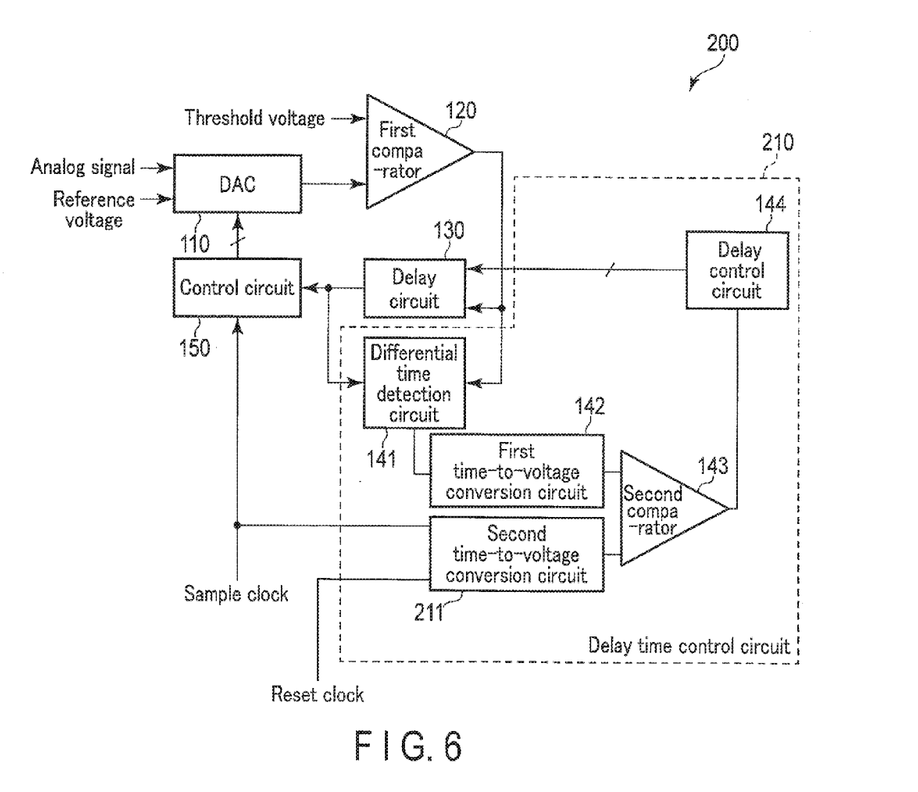
FIG. 6 is a block diagram exemplifying an ADC according to a second embodiment.

As exemplified in FIG. 6, an ADC 200 according to the second embodiment includes a DAC 110, a first comparator 120, a delay circuit 130, a delay time control circuit 210, and a control circuit 150. The delay time control circuit 210 includes a differential time detection circuit 141, a first time-to-voltage conversion circuit 142, a second comparator 143, a delay control circuit 144, and a second time-to-voltage conversion circuit 211.

The second time-to-voltage conversion circuit 211 corresponds to, for example, a charge pump circuit. The second time-to-voltage conversion circuit 211 receives a sample clock and a reset clock from an unillustrated circuit. The second time-to-voltage conversion circuit 211 generates the adjustment target voltage by performing time-to-voltage conversion during $T_{sample}$ which corresponds to a sampling period of the analog signal. The second time-to-voltage conversion circuit 211 resets the adjustment target voltage by the reset clock. The operation of the second time-to-voltage conversion circuit 211 will be explained in detail later on. The second time-to-voltage conversion circuit 211 outputs the adjustment target voltage to the second comparator 143. For the second time-to-voltage conversion circuit 211, other circuits capable of converting a time signal into a voltage may also be used.

Figure 7:
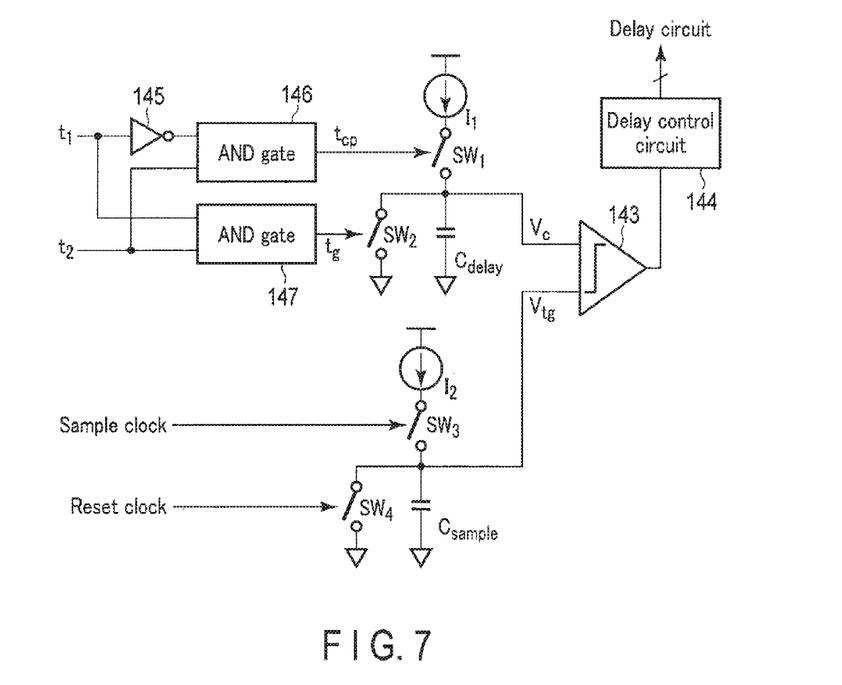
FIG. 7 is a diagram exemplifying the delay time control circuit depicted in FIG. 6.

FIG. 7 shows a specific example of the delay time control circuit 210. The differential time detection circuit 141 includes an INV gate 145, an AND gate 146, and an AND gate 147. The first time-to-voltage conversion circuit 142 includes a constant current source $I_1$, a switch $SW_1$, a switch $SW_2$, and a capacitor $C_{delay}$. The second time-to-voltage conversion circuit 211 includes a constant current source $I_2$, a switch $SW_3$, a switch $SW_4$, and a capacitor $C_{sample}$.

The constant current source $I_2$ generates a constant current signal. The switch $SW_3$ receives the sample clock from an unillustrated circuit, and receives the constant current signal from the constant current source $I_2$. If the sample clock is the $T_{sample}$ (High level), the switch $SW_3$ is turned ON to supply the constant current signal to the capacitor $C_{sample}$. On the other hand, if the sample clock is the $T_{convert}$ (Low level), the switch $SW_3$ is turned OFF, and the circuit is released.

The capacitor $C_{sample}$ generates a voltage $V_{tg}$ (=$(I_2 \times T_{sample})/C_{sample}$) on both ends of an electrode according to the time the constant current signal is supplied. The voltage $V_{tg}$ corresponds to the adjustment target voltage mentioned above.

The switch $SW_4$ receives the reset clock from an unillustrated circuit. If the reset clock is at the High level, the switch $SW_4$ is turned ON, and the voltage $V_{tg}$ applied on both ends of the electrode of the capacitor $C_{sample}$ is reset. On the other hand, if the reset clock is at the Low level, the switch $SW_4$ is turned OFF, and the circuit is released.

Here, the delay time control circuit 210 controls the values of the voltage $C_c$ and the voltage $V_{tg}$ so as to become equal, and determines the delay time $T_{delay}$ (=$T_{sample} \times (C_{delay}/C_{sample})$). In other words, the delay time is determined by the $T_{sample}$ of the sample clock and a capacitance ratio of the capacitor. An equal value is used for the constant current signals of the constant current sources I1 and I2; however, the value may also be different.

Figure 8:
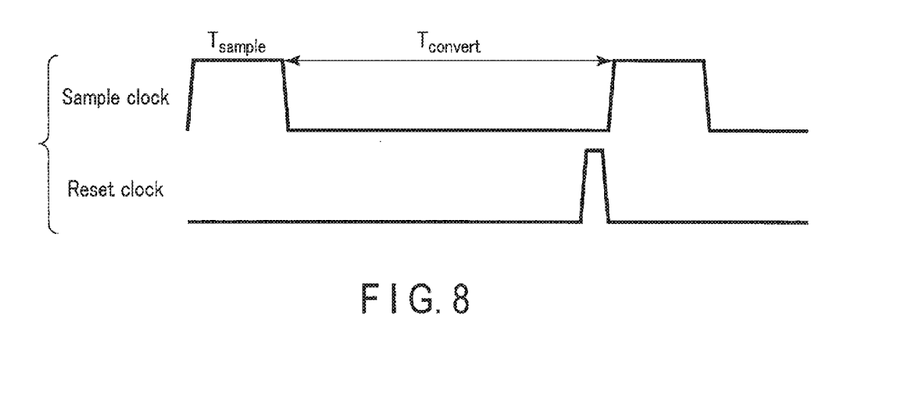
FIG. 8 is a timing chart exemplifying a sample clock and a reset clock.

FIG. 8 exemplifies a timing chart of the sample clock and the reset clock. The second time-to-voltage conversion circuit 211 stores charges in the capacitor $C_{sample}$ in the $T_{sample}$ of the sample clock (i.e., the voltage $V_{tg}$ increasing), and holds the voltage $V_{tg}$ in the $T_{convert}$. The second time-to-voltage conversion circuit 211 resets the charges in the capacitor $C_{sample}$ (i.e., the voltage $V_{tg}$ becomes 0) when the reset clock becomes the High level.

As explained above, the analog-to-digital converter according to the second embodiment generates the adjustment target voltage at the internal circuit ADC, and controls the delay time by the capacitance ratio of the capacitor. In the first embodiment mentioned above, it is necessary to set the adjustment target voltage from outside to a voltage value in accordance with the variation in capacitance (absolute variation) of the capacitor $C_{delay}$. Generally, the absolute variation has a greater variation than the variation in a relative capacitor (variation in the capacitance ratio of the capacitor). Therefore, the analog-to-digital converter in the present embodiment is capable of suppressing the absolute variation by controlling the delay time by the capacitance ratio of the capacitor.

Third Embodiment

The ADC 100 and the ADC 200 mentioned above control all of the AD conversion times per cycle to be equal. On the other hand, an ADC according to the third embodiment is capable of controlling the AD conversion time in accordance with each AD conversion cycle.

Figure 9:
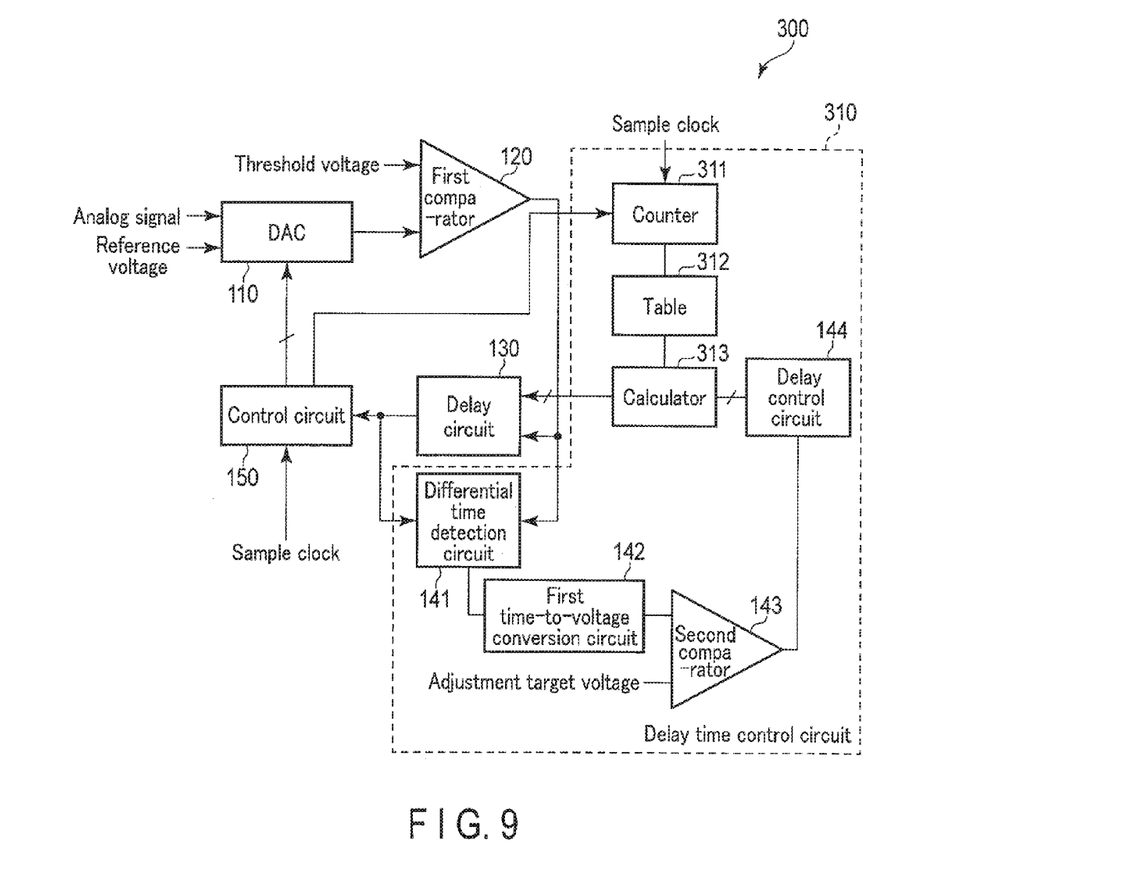
FIG. 9 is a block diagram exemplifying an ADC according to a third embodiment.

As exemplified in FIG. 9, an ADC 300 according to the third embodiment includes a DAC 110, a first comparator 120, a delay circuit 130, a delay time control circuit 310, and a control circuit 150. The delay time control circuit 310 includes a differential time detection circuit 141, a first time-to-voltage conversion circuit 142, a second comparator 143, a delay control circuit 144, a counter 311, a table 312, and a calculator 313.

The control circuit 150 outputs a control signal $t_{DAC}$ to the DAC 110, and outputs conversion cycle information to the counter 311. The delay control circuit 144 outputs a delay control signal to the calculator 313. The delay circuit 130 receives a calculation signal corresponding to the delay control signal from the calculator 313. The delay circuit 130 controls a delay time based on the calculation signal, and generates a delay comparison signal $t_2$ which is obtained by delaying a comparison signal $t_1$ by the delay time.

The counter 311 receives the sample clock from an unillustrated circuit, and receives the conversion cycle information from the control circuit 150. The counter 311 starts counting at a timing when the sample clock shifts to the $T_{convert}$. The counter 311 counts the number of conversion cycles of the AD conversion cycle based on the conversion cycle information. The counter 311 outputs a cycle number signal indicating the number of conversion cycles to the table 312.

The table 312 corresponds to, for example, a lookup table. The table 312 receives the number of conversion cycles included in the cycle number signal from the counter 311. The table 312 stores a coefficient corresponding to the number of conversion cycles. For example, data may be stored in the table 312 in a manner so that the value of the coefficient is maintained or reduced as the number of conversion cycles increases. The table 312 outputs the coefficient corresponding to the number of conversion cycles to the calculator 313 as a coefficient signal.

The calculator 313 corresponds to, for example, a divider. The calculator 313 receives the coefficient signal from the table 312, and receives the delay control signal from the delay control circuit 144. The calculator 313 generates a calculation signal by calculating the delay control signal and the coefficient included in the coefficient signal. The calculator 313 outputs the calculation signal to the delay circuit 130. The calculator 313 may also be a multiplier or subtractor. In other words, the calculator 313 should calculate the coefficient in a manner so that the delay time is maintained or reduced as the number of conversion cycles increases.

Specifically, the calculator 313 sets the coefficient to "1" when a delay adjustment is performed in the delay time control circuit 310 (i.e., when all of the AD conversion times per cycle are controlled to be equal). After the output of the delay control circuit 144 is stabilized, the calculator 313 performs calculation by using a coefficient in accordance with the number of conversion cycles.

As explained above, the analog-to-digital converter according to the third embodiment controls the AD conversion time in accordance with each AD conversion cycle. Therefore, this analog-to-digital converter is capable of optimally setting the time necessary for each of the AD conversion cycles. Therefore, according to this analog-to-digital converter, the time from sampling to output may be shortened.

An ordinary ADC controls all of the AD conversion times per cycle to be equal. However, in the SARADC, a time required for an AD conversion cycle of a most significant bit is long, and a time required for an AD conversion cycle of a least significant bit is short. Therefore, in the case where the AD conversion time is constant per cycle, as the target of AD conversion moves on from the upper bit to the lower bit, a redundant conversion time increases. Accordingly, by changing the AD conversion time for each cycle, the redundant conversion time may be reduced.

Fourth Embodiment

In the ADC 300 mentioned above, an adjustment target voltage is input from an unillustrated circuit. On the other hand, an ADC according to the fourth embodiment is capable of generating the adjustment target voltage at an internal circuit of the ADC.

Figure 10:
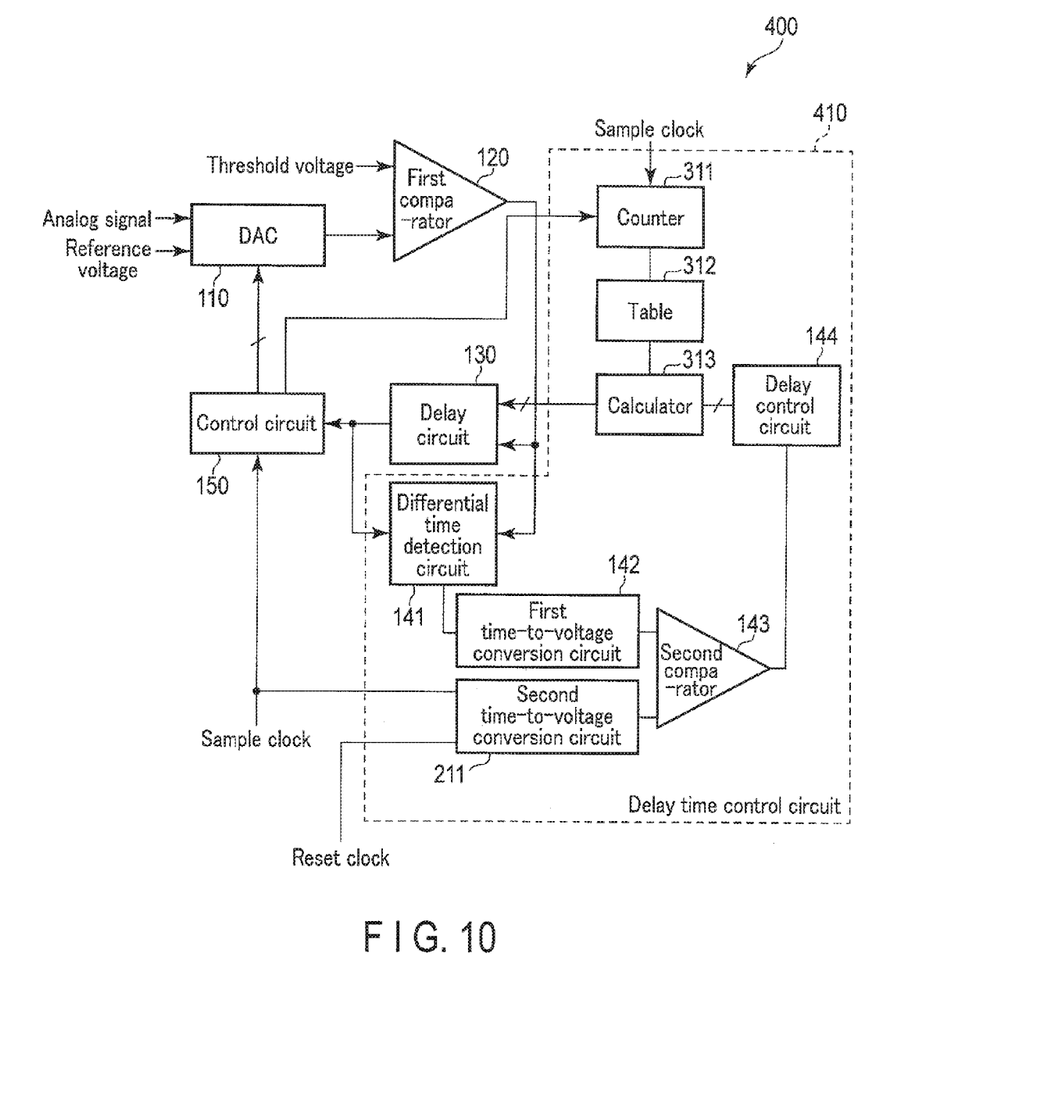
FIG. 10 is a block diagram exemplifying an ADC according to a fourth embodiment.

As exemplified in FIG. 10, the ADC 400 according to the fourth embodiment includes a DAC 110, a first comparator 120, a delay circuit 130, a delay time control circuit 410, and a control circuit 150. The delay time control circuit 410 includes a differential time detection circuit 141, a first time-to-voltage conversion circuit 142, a second comparator 143, a delay control circuit 144, a second time-to-voltage conversion circuit 211, a counter 311, a table 312, and a calculator 313. The explanation on each unit will be omitted since they are explained by the corresponding portions in the first to third embodiments.

As explained above, the analog-to-digital converter according to the fourth embodiment generates the adjustment target voltage in the internal circuit of the ADC, controls a delay time by a capacitance ratio of a capacitor, and controls an AD conversion time in accordance with each AD conversion cycle. Accordingly, this analog-to-digital converter is capable of producing the same effect as the analog-to-digital converter according to the first to third embodiments.

Fifth Embodiment

The ADCs 100, 200, 300, and 400 mentioned above may be applied to an ADC used for, for example, a radiation detector.

Figure 11:
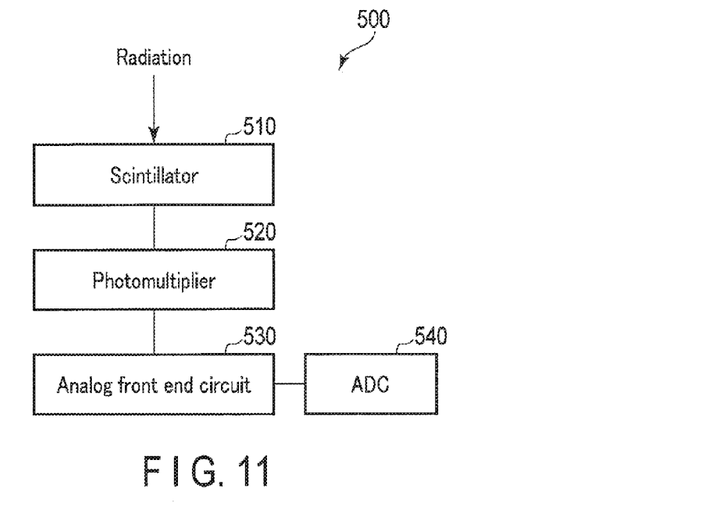
FIG. 11 is a block diagram exemplifying a radiation detector according to a fifth embodiment.

As exemplified in FIG. 11, a radiation detector 500 according to the fifth embodiment includes a scintillator 510, a photomultiplier 520, an analog front end circuit 530, and an ADC 540. The ADC 540 may be the same as or similar to the ADCs 100, 200, 300, and 400 mentioned above.

In the scintillator 510, radiation enters from outside. The scintillator 510 converts the radiation into an optical signal. The intensity of the optical signal corresponds to the intensity of the radiation. The scintillator 510 outputs the optical signal to the photomultiplier 520.

The photomultiplier 520 receives the optical signal from the scintillator 510. The photomultiplier 520 converts the optical signal into an electrical signal. The photomultiplier 520 outputs the electrical signal to the analog front end circuit 530.

The analog front end circuit 530 receives the electrical signal from the photomultiplier 520. The analog front end circuit 530 converts the electrical signal into a voltage signal. The analog front end circuit 530 outputs the voltage signal (corresponding to an analog signal) to the ADC 540.

The ADC 540 receives the voltage signal from the analog front end circuit 530. The ADC 540 generates a digital signal by performing analog-to-digital conversion on the voltage signal. The ADC 540 outputs the digital signal to an unillustrated digital signal processing circuit.

As explained above, the radiation detector according to the fifth embodiment includes one of the analog-to-digital converters according to the first to fourth embodiments mentioned above. Therefore, according to this radiation detector, the power consumption of the delay time control circuit in the analog-to-digital converter may be reduced, and the delay time can be adjusted in the background.

Sixth Embodiment

The ADCs 100, 200, 300, and 400 mentioned above may be applied to an ADC used for, for example, a wireless receiver.

Figure 12:
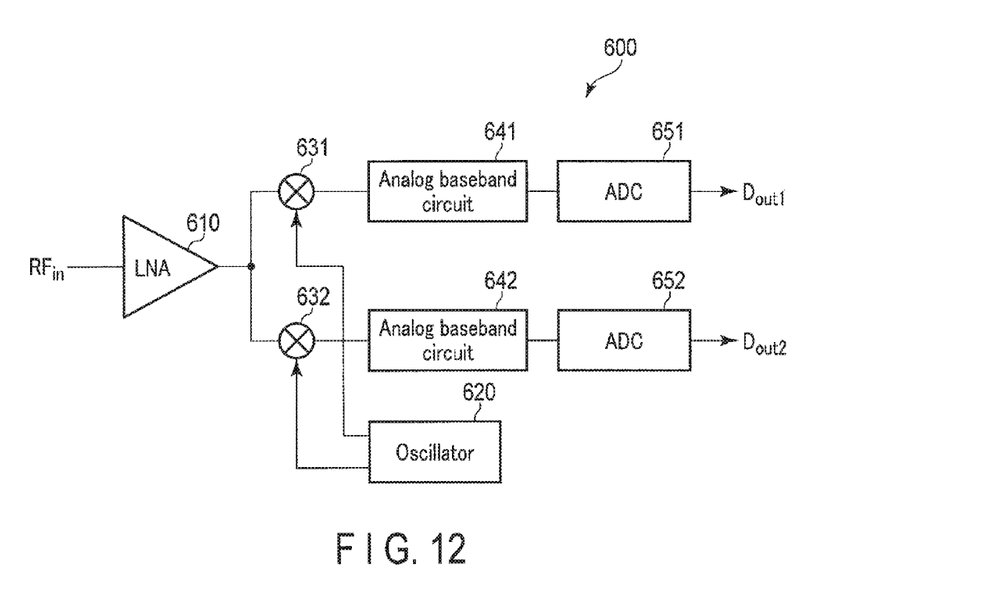
FIG. 12 is a block diagram exemplifying a wireless receiver according to a sixth embodiment.

As exemplified in FIG. 12, a wireless receiver 600 according to the sixth embodiment corresponds to a receiver using an orthogonal demodulator. The wireless receiver 600 includes a low noise amplifier (LNA) 610, an oscillator 620, a mixer 631, a mixer 632, an analog baseband circuit 641, an analog baseband circuit 642, an ADC 651, and an ADC 652. The ADC 651 and the ADC 652 may be the same as or similar to the ADCs 100, 200, 300, and 400 mentioned above. The wireless receiver 600 may also be a receiver using an optional demodulator.

In the LNA 610, a radio-frequency (RF) signal ($RF_{in}$) is input from an unillustrated antenna. The LNA 610 generates an amplified RF signal (also referred to as an amplified signal) by performing low noise amplification to the RF signal. The LNA 610 outputs the amplified RF signal to the mixer 631 and the mixer 632.

The oscillator 620 corresponds to, for example, a local oscillator. The oscillator 620 generates two local signals having different phases. The oscillator 620 outputs a first local signal to the mixer 631, and outputs a second local signal to the mixer 632.

The mixer 631 receives the amplified RF signal from the LNA 610, and receives the first local signal from the oscillator 620. The mixer 631 generates a first product signal by multiplying the amplified RF signal by the first local signal. The mixer 631 outputs the first product signal to the analog baseband circuit 641.

The analog baseband circuit 641 receives the first product signal from the mixer 631. The analog baseband circuit 641 generates a first baseband signal (corresponding to an analog signal) by suppressing a high frequency component of the first product signal. The analog baseband circuit 641 outputs the first baseband signal to the ADC 651.

The ADC 651 receives the first baseband signal from the analog baseband circuit 641. The ADC 651 generates a first digital signal ($D_{out1}$) by performing an analog-to-digital conversion on the first baseband signal. The ADC 651 outputs the first digital signal to an unillustrated digital signal processing circuit.

The mixer 632 receives the amplified RF signal from the LNA 610, and receives the second local signal from the oscillator 620. The mixer 632 generates a second product signal by multiplying the amplified RF signal by the second local signal. The mixer 632 outputs the second product signal to the analog baseband circuit 642.

The analog baseband circuit 642 receives the second product signal from the mixer 632. The analog baseband circuit 642 generates a second baseband signal (corresponding to an analog signal) by suppressing a high frequency component of the second product signal. The analog baseband circuit 642 outputs the second baseband signal to the ADC 652.

The ADC 652 receives the second baseband signal from the analog baseband circuit 642. The ADC 652 generates a second digital signal ($D_{out2}$) by performing analog-to-digital conversion on the second baseband signal. The ADC 652 outputs the second digital signal to an unillustrated digital signal processing circuit.

As explained above, the wireless receiver according to the sixth embodiment includes one of the analog-to-digital converters according to the first to fourth embodiments mentioned above. Therefore, according to this wireless receiver, the power consumption of the delay time control circuit in the analog-to-digital converter may be reduced, and the delay time can be adjusted in the background.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An analog-to-digital converter comprising:
a digital-to-analog converter that controls a reference voltage to a predetermined value based on a control signal, and that generates a residual voltage using an analog signal and the controlled reference voltage;
a first comparator that generates a digital comparison signal by comparing the residual voltage and a threshold voltage;
a delay circuit that controls a delay time based on a delay control signal, and that generates a delay comparison signal obtained by delaying the digital comparison signal by the delay time;
a detection circuit that detects a differential time signal corresponding to the delay time by using the digital comparison signal and the delay comparison signal;
a first conversion circuit that generates a differential voltage by performing time-to-voltage conversion on the differential time signal;
a second comparator that generates a digital delay determination signal by comparing the differential voltage and an adjustment target voltage;
a delay control circuit that generates the delay control signal controlling the delay time in accordance with the digital delay determination signal; and
a control circuit that receives a sample clock including a first state corresponding to an analog-to-digital conversion period of the analog signal, and that generates the control signal by using the delay comparison signal in the first state.

2. The converter according to claim 1, further comprising:
a second conversion circuit that receives the sample clock further including a second state corresponding to a sample period of the analog signal, and that generates the adjustment target voltage by performing time-to-voltage conversion during the second state.

3. The converter according to claim 1, wherein:
the control circuit holds conversion cycle information which indicates switching of a conversion cycle of each analog-to-digital conversion of the analog signal;
the analog-to-digital converter further comprises:
a counter that receives the sample clock, and that counts a number of conversion cycles of the conversion cycle based on the conversion cycle information in the first state;
a table which selects a coefficient corresponding to the number of conversion cycles; and
a calculator that generates a calculation signal by calculating the delay control signal and the coefficient; and
the delay circuit controls the delay time based on the calculation signal corresponding to the delay control signal.

4. The converter according to claim 3, wherein the delay circuit is controlled to maintain or reduce the delay time in accordance with an increase in the number of conversion cycles.

5. A radiation detector comprising:
a scintillator that converts an incident radiation into an optical signal;
a photomultiplier that converts the optical signal into an electrical signal;
an analog front end circuit that converts the electrical signal into a voltage signal; and
the analog-to-digital converter according to claim 1, which generates a digital signal by performing an analog-to-digital conversion on the voltage signal, which corresponds to the analog signal.

6. The detector according to claim 5, the analog-to-digital converter further comprising:
a second conversion circuit that receives the sample clock further including a second state corresponding to a sample period of the analog signal, and that generates the adjustment target voltage by performing time-to-voltage conversion during the second state.

7. The detector according to claim 5, wherein:
in the analog-to-digital converter, the control circuit holds conversion cycle information which indicates switching of a conversion cycle of each analog-to-digital conversion of the analog signal;
the analog-to-digital converter further comprises:
a counter that receives the sample clock, and that counts a number of conversion cycles of the conversion cycle based on the conversion cycle information in the first state;
a table which selects a coefficient corresponding to the number of conversion cycles; and
a calculator that generates a calculation signal by calculating the delay control signal and the coefficient; and
in the analog-to-digital converter, the delay circuit controls the delay time based on the calculation signal corresponding to the delay control signal.

8. The detector according to claim 7, wherein, in the analog-to-digital converter, the delay circuit is controlled to maintain or reduce the delay time in accordance with an increase in the number of conversion cycles.

9. A wireless receiver comprising:
a low noise amplifier that generates an amplified signal by performing low noise amplification on a radio frequency signal;
an oscillator that generates a local signal;
a mixer that generates a product signal by multiplying the amplified signal and the local signal;
an analog baseband circuit that generates a baseband signal by suppressing a high frequency component in the product signal; and
the analog-to-digital converter according to claim 1, which generates a digital signal by performing an analog-to-digital conversion on the baseband signal, which corresponds to the analog signal.

10. The receiver according to claim 9, the analog-to-digital converter further comprising:
a second conversion circuit that receives the sample clock further including a second state corresponding to a sample period of the analog signal, and that generates the adjustment target voltage by performing time-to-voltage conversion during the second state.

11. The receiver according to claim 9, wherein:
in the analog-to-digital converter, the control circuit holds conversion cycle information which indicates switching of a conversion cycle of each analog-to-digital conversion of the analog signal;
the analog-to-digital converter further comprises:
a counter that receives the sample clock, and that counts a number of conversion cycles of the conversion cycle based on the conversion cycle information in the first state;
a table which selects a coefficient corresponding to the number of conversion cycles; and
a calculator that generates a calculation signal by calculating the delay control signal and the coefficient; and
in the analog-to-digital converter, the delay circuit controls the delay time based on the calculation signal corresponding to the delay control signal.

12. The receiver according to claim 11, wherein, in the analog-to-digital converter, the delay circuit is controlled to maintain or reduce the delay time in accordance with an increase in the number of conversion cycles.

\* \* \* \* \*